(12) United States Patent
Wei (10) Patent No.: US 8,547,021 B2
(45) Date of Patent: Oct. 1, 2013

(54) PLASMA PROCESSING APPARATUS

(75) Inventor: Gang Wei, Beijing (CN)

(73) Assignee: Beijing NMC Co. Ltd., Beijing (CN)

( * ) Notice: Subject to any disclaimer, the term of this patent is extended or adjusted under 35 U.S.C. 154(b) by 195 days.

(21) Appl. No.: 13/127,665

(22) PCT Filed: Oct. 20, 2009

(86) PCT No.: PCT/CN2009/074532
§ 371 (c)(1),
(2), (4) Date: May 4, 2011

(87) PCT Pub. No.: WO2010/066151
PCT Pub. Date: Jun. 17, 2010

(65) Prior Publication Data
US 2011/0241547 A1    Oct. 6, 2011

(30) Foreign Application Priority Data
Dec. 9, 2008   (CN) ........................ 2008 1 0224715

(51) Int. Cl.
*H01J 7/24* (2006.01)

(52) U.S. Cl.
USPC .................. 315/111.21; 315/111.71; 315/355; 156/345.44; 156/345.47; 118/719; 118/723 R (58) Field of Classification Search
USPC ............... 315/111.21–111.91, 353, 355, 356; 118/719, 723 R, 723 E; 156/345.44, 345.45, 156/345.47
See application file for complete search history.

(56) References Cited

U.S. PATENT DOCUMENTS

| | | | | |
|---|---|---|---|---|
| 6,488,807 B1 * | 12/2002 | Collins et al. | ............ | 156/345.49 |
| 6,632,324 B2 * | 10/2003 | Chan | ........ | 156/345.48 |
| 7,520,244 B2 * | 4/2009 | Yamagishi et al. | ....... | 118/723 E |
| 8,317,969 B2 * | 11/2012 | Iwata | ....................... | 156/345.44 |
| 2003/0079983 A1 * | 5/2003 | Long et al. | ..................... | 204/164 |
| 2005/0031796 A1 | 2/2005 | Wu et al. | | |
| 2008/0210166 A1 * | 9/2008 | Yan | ........................... | 118/723 E |

FOREIGN PATENT DOCUMENTS

| | | |
|---|---|---|
| CN | 1577730 A | 2/2005 |
| CN | 1957437 A | 5/2007 |
| JP | 2001-144079 A | 5/2001 |

OTHER PUBLICATIONS

Form PCT/ISA/210, International Search Report for PCT/CN2009/074532 mailed Jan. 28, 2010.

* cited by examiner

*Primary Examiner* — Haiss Philogene
(74) *Attorney, Agent, or Firm* — Edwards Wildman Palmer LLP; Howard M. Gitten (57) ABSTRACT

A plasma processing device includes a first electrode plate (3), a second electrode plate (4), a matching device (8), a power distribution device (9) and a power supply device (1). The first electrode plate (3) includes at least two sub-electrode plates (31, 32) insulated from each other; the power supply device (1) is connected to the power distribution device (9) via the matching device (8); the power distribution device (9) is connected to the first electrode plate (3) for inputting and distributing the power of the power supply device (1) to each of the sub-electrode plates (31, 32); the power distribution device (9) at least includes capacitors (C1, C2) and/or inductances (L1, L2). The plasma processing device distributes the power of the power supply device (1) into several portions corresponding to the number of the sub-electrodes (31, 32) through the power distribution device (9), and each portion of the power is individually inputted to the corresponding sub-electrode (31, 32) to acquire individual electric field distribution between each sub-electrode plate (31, 32) and the second electrode plate (4).

10 Claims, 5 Drawing Sheets

PLASMA PROCESSING APPARATUS

CROSS REFERENCES TO RELATED APPLICATIONS

This application is a U.S. national phase application pursuant to 35 U.S.C. §371, of PCT/CN2009/074532 filed on Oct. 20, 2009, which claims priority to Chinese Patent Application No. 200810224715.X filed on Dec. 9, 2008. The entire contents of the aforementioned patent applications are incorporated herein by these references.

FIELD OF THE INVENTION

The present invention relates to the field of plasma processing technology, specifically to a plasma processing apparatus.

BACKGROUND OF THE INVENTION

Plasma processing apparatuses are widely used in manufacturing process of integrated circuit (IC) or photovoltaic cell with the development of plasma technology. Research on plasma processing apparatuses which are suitable for etch, deposition or some other process is very important to the development of the manufacturing process of IC or photovoltaic cell.

Currently, parallel plate Capacitively Coupled Plasma (CCP) processing apparatuses are often used in the industry of IC or photovoltaic cell. The principle of generating plasma by such apparatuses is very simple: generally one electrode plate is applied with RF power, the other electrode plate is grounded, and the generation and maintain of CCP mainly rely on the RF electrical field between two electrode plates.

Figure 1:
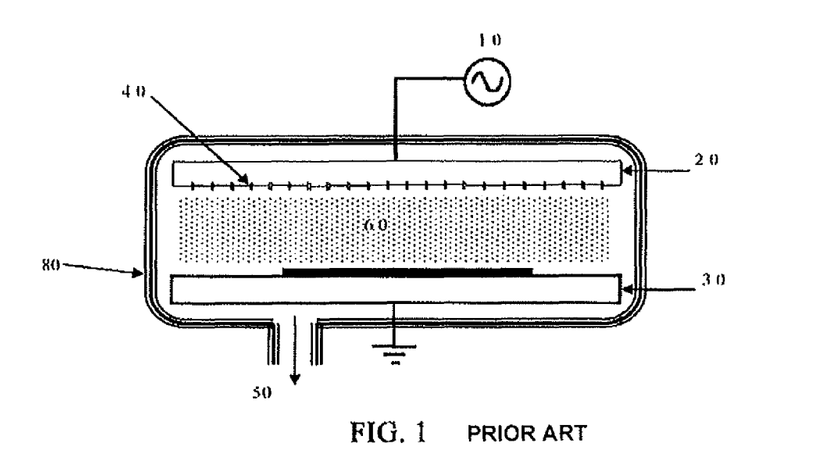
FIG. 1 is a schematic diagram of a parallel plate capacitively coupled PECVD apparatus as known in the prior art.

For example, FIG. 1 shows a parallel plate capacitively coupled Plasma Enhanced Chemical Vapor Deposition (PECVD) apparatus which is commonly used in practice. Such PECVD apparatus includes: a reaction chamber 80, a power supply 10 and a match coupling device (not shown) outside the reaction chamber 80, an upper electrode 20 which locates in the reaction chamber 80 and is connected with the power supply 10, a grounded electrode 30 inside the reaction chamber 80. Densely distributed gas inlet holes 40 are provided on the upper electrode plate 20; a gas outlet port 50 is provided bottom of the reaction chamber 80; and a substrate to be processed locates on the grounded electrode 30.

During the operation of the PECVD apparatus, under a suitable vacuum condition, process gas is introduced into the reaction chamber 80 through the gas inlet holes 40; the process gas between the upper electrode 20 and the grounded electrode 30 is excited by the power supply to generate plasma 60; the plasma 60 reacts with the substrate; and product of the reaction deposits on the substrate so as to form a film, while waste gas produced by such reaction is drawn out via the gas outlet port 50.

Currently, however, requirement of the industry of IC or photovoltaic cell with respect to productivity is highly increased, that is, under the condition of ensuring the quality of the etch process or the deposit process, more products need to be produced within the same time interval. In order to meet such requirement, apparatus manufacturers increase the size of plasma apparatuses continuously, so that a larger wafer can be processed in one process to improve the productivity of apparatuses.

Although the commonly used parallel plate CCP apparatuses can produce relatively uniform plasma compared to other plasma apparatuses (e.g. an electron cyclotron resonance plasma processing apparatus and an inductively coupled plasma processing apparatus). However, with the increase of the size of the reaction chamber and the increase of the area of the electrode plates, especially when the frequency of the power supply is comparatively higher, a standing wave effect and an edge effect will occur in such parallel plate CCP apparatus. The standing wave effect and the edge effect have great influence on the uniformity of the generated plasma and usually cause a phenomenon that the plasma at the center of the electrode plate has a higher density and the plasma at the edge has a lower density, so that the uniformity of the result of plasma processing process is thus influenced.

SUMMARY

A technical problem to be solved by the present invention is to provide a plasma processing apparatus capable of obtaining uniform plasma distribution, thus improving the uniformity of the result of plasma processing process.

In order to solve the above technical problem, the present invention provides a plasma processing apparatus including: a first electrode plate and a second electrode plate which are arranged opposite to each other, a matching device, a power distribution device and a power supply device;

the first electrode plate includes at least two sub-electrode plates insulated from each other;

the power supply device is connected to the power distribution device through the matching device;

the power distribution device is connected to the first electrode plate, for inputting and distributing the power of the power supply device to each of the sub-electrode plates, and the power distribution device includes at least a capacitor and/or an inductor.

The power distribution device includes at least two distribution units, the number of the distribution units is the same as that of the sub-electrode plates and each one of the distribution units is individually connected to one sub-electrode plate.

The distribution units can be identical or different, and each one of the distribution units includes a capacitor and/or an inductor.

The inductor is an adjustable inductor.

The capacitor is an adjustable capacitor.

The at least two sub-electrode plates include a first sub-electrode plate and a second sub-electrode plate; the power distribution device includes a first capacitor and a second capacitor; the matching device is directly connected to the first sub-electrode plate; and the second capacitor and the second sub-electrode plate are connected in parallel, in turn connected to the first capacitor in series, and then connected to the matching device.

The at least two sub-electrode plates include N sub-electrode plates; accordingly, the power distribution device includes M capacitors, wherein the $M^{th}$ capacitor and the $N^{th}$ sub-electrode plate are connected in parallel and then connected to the $(M-1)^{th}$ capacitor in series so as to form the $(N-1)^{th}$ series circuit; the $(N-1)^{th}$ series circuit, the $(N-1)^{th}$ sub-electrode plate and the $(M-2)^{th}$ capacitor are connected in parallel and then connected to the $(M-3)^{th}$ capacitor in series so as to form the $(N-2)^{th}$ series circuit, and so forth; until a series circuit formed by all foregoing capacitors and sub-electrode plates, a second sub-electrode plate and a second capacitor are connected in parallel and then connected to a first capacitor in series so as to form a first series circuit, and the first series circuit and a first sub-electrode plate are connected in parallel and then connected to the matching device; wherein $M=2(N-1)$, and N is an integral number no less than 3.

The capacitors are adjustable capacitors.

The at least two sub-electrode plates are arranged so that they are parallel, centrally symmetric, axially symmetric or concentrically nested in a plane parallel to the second electrode plate.

Shapes of the at least two sub-electrode plates can be identical or different, and the sub-electrode plates are rectangular, square, circular, or elliptical.

The above technical solutions have the following advantages:

The power distribution device in the plasma processing apparatus includes at least two distribution units and the first electrode plate includes at least two sub-electrode plates, and respective distribution units are connected in parallel after being connected to a respective corresponding sub-electrode plate which are insulated from each other. At this time, the power supply device is connected to the power distribution device via the matching device, and the power of the power supply device is distributed into several portions corresponding to the number of the sub-electrode plates of the first electrode plate by the power distribution device, wherein each portion of the power is individually input to a corresponding sub-electrode plate, and an individual electric field is obtained between each sub-electrode plate and the second electrode plate to control the density and the intensity of plasma generated under each sub-electrode plate so that adjustment of the process result can be achieved to obtain an uniform process result. Further, since the power distribution device is constituted by a combination of some capacitors and/or sonic inductors, when RF current flows through, the capacitors and the inductors do not consume energy as resistors, and the efficiency of RF power coupled to the electrodes can be guaranteed.

BRIEF DESCRIPTION OF THE DRAWINGS

In connection with the accompanying Figures, the above and other objects, features and advantages of the present invention will become more apparent. In all these figures, the same element is indicated by the same reference numeral. It is not intended to draw these figures in scale, and it is intended to show the concept of the invention.

DETAILED DESCRIPTION OF EMBODIMENTS

In order to make the above objects, features and advantages of the present invention more apparent and easier to be understood, a further detailed description is made to embodiments of the present invention in connection with the accompanying figures. For sake of the description, cross-sectional drawings indicating structures of the device are locally enlarged not in general scale, and the schematic diagrams are illustrative and are not intended to limit the scope of the present invention when embodiments of the present invention are described with reference to the schematic diagrams hereinafter. Moreover, in practice, 3D size of length, width and depth should be included.

In order to emphasize the characteristic of the present invention, parts which are not inevitably and directly correlated to the concept of the present invention are not shown in the Figures, such as a vacuum obtaining device, a gas input device and so on.

In the following description, numerous details are set forth in order to sufficiently understand the present invention, however, other manners rather than the described manners could also be applied to implement the present invention, and thus, the present invention is not limited by the disclosed specific embodiments.

As previously mentioned, with the increase of the area of the substrate to be processed, the plasma processing apparatus in the art faces the problem of uniformity of the processing result in the process such as etch or deposition applied to a big area. Furthermore, with the increase of the size of the reaction chamber and the increase of the area of the electrode plates, especially when the frequency of the power supply is comparatively higher, a comparatively obvious standing wave effect and a comparatively obvious edge effect will occur with the plasma processing apparatus in the art. The standing wave effect and the edge effect have great influence on the uniformity of the generated plasma and usually cause a phenomenon that the plasma at the center of the electrode plate has a higher density and the plasma at the edge has a lower density, so that the uniformity of the result of plasma processing process is thus influenced. In view of that, the present invention provides a plasma processing apparatus. The apparatus has a first electrode plate including at least two sub-electrode plates, and power of a power supply device is input into and distributed on the respective sub-electrode plates by a power distribution device connected to the first electrode plate, so that the standing wave effect and the edge effect can be suppressed, the uniform distribution of plasma is obtained, and the uniformity of the plasma processing process is increased.

In the following, a PECVD apparatus is used as an example, and specific embodiments of the plasma processing apparatus of the present invention are described in connection with the figures.

First Embodiment

Figure 2:
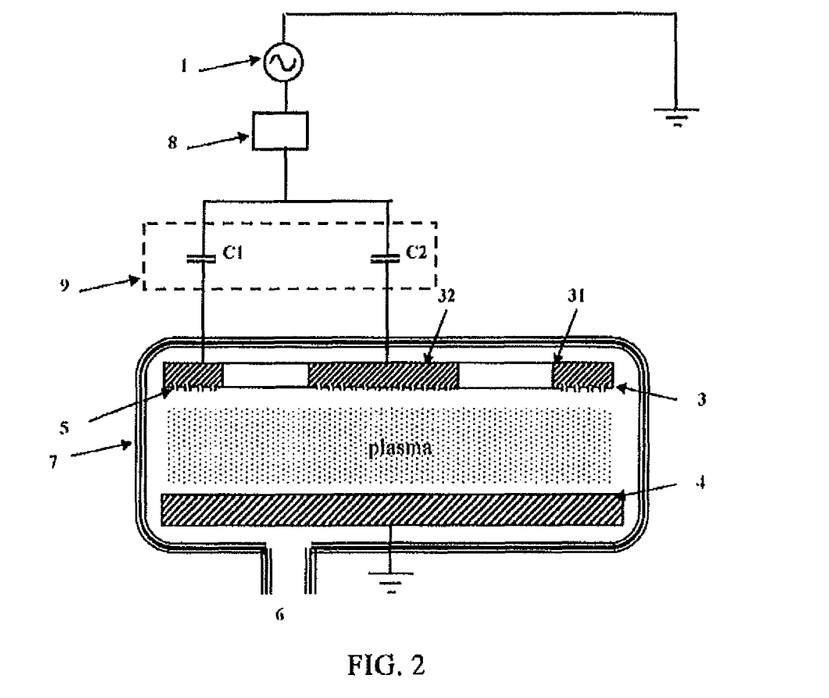
FIG. 2 is a schematic diagram of a plasma processing apparatus in the first embodiment.
Figure 3:
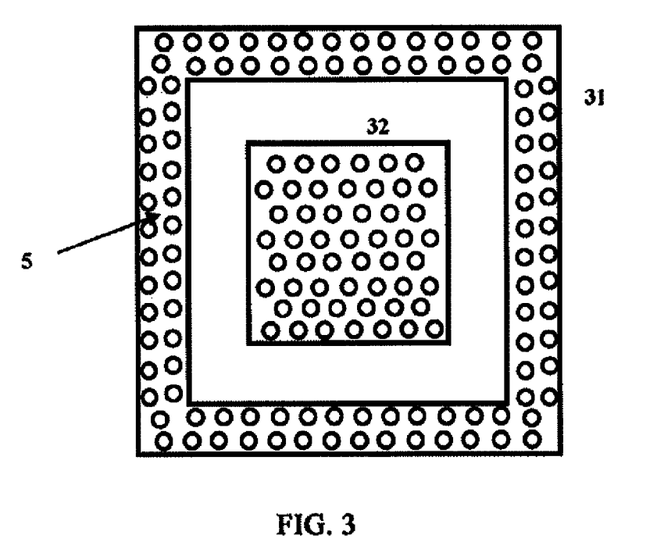
FIG. 3 is a bottom view of a first electrode plate in FIG. 2.
Figure 4:
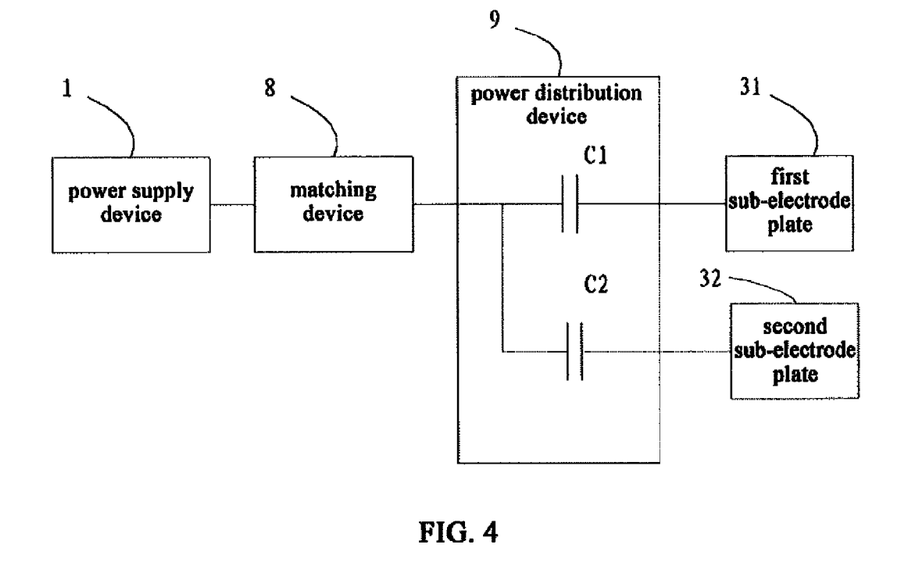
FIG. 4 is a schematic diagram of a circuit of the plasma processing apparatus in FIG. 2.

Reference is made to FIG. 2, FIG. 3 and FIG. 4, wherein, FIG. 2 is a schematic diagram of a structure of a plasma processing apparatus in the embodiment; FIG. 3 is a bottom view of a first electrode plate in FIG. 2; and FIG. 4 is a schematic diagram of a circuit of the plasma processing apparatus in FIG. 2.

As shown in FIG. 2, the plasma processing apparatus in this embodiment includes: a reaction chamber 7, a first electrode plate 3 and a second electrode plate 4 which are arranged opposite to each other in the reaction chamber 7, a matching device 8 connected to the first electrode plate 3, a power distribution device 9, a power supply device 1, a vacuum obtaining device (not shown), and a gas input device (not shown).

Among these, the first electrode plate 3 includes two sub-electrode plates 31 and 32 which are insulated from each other (FIG. 3). It could be appreciated that in practice, the number of the sub-electrode plates included in the first electrode plate 3 is not limited to two, but could be more than two.

The power supply device 1 is connected to the power distribution device 9 via the matching device 8. The power supply device 1 in this embodiment may be one of a RF power supply, a low frequency power supply, and a high frequency power supply.

The power distribution device 9 is connected to the first electrode plate 3, for inputting and distributing the power of the power supply device 1 to the two sub-electrode plates 31 and 32.

In this embodiment, the power distribution device 9 includes two distribution units, wherein each distribution unit is individually connected to one sub-electrode plate as above described, and the respective distribution units could be identical. It could also be appreciated that the number of the distribution units included in the power distribution device 9 is the same as that of the sub-electrode plates included in the first electrode plate 3. That is to say, when the number of the sub-electrode plates included in the first electrode plate 3 is more than two, the number of the distribution units included in the power distribution device 9 is correspondingly more than two and equals the number of the sub-electrode plates included in the first electrode plate 3.

The first electrode plate 3 locates in the top of the reaction chamber 7, and is thus referred to as an upper electrode; while the second electrode plate 4 is connected to the ground via the housing of the reaction chamber 7, and is thus referred to as a grounded electrode. The matching device 8, the power distribution device 9 and the power supply device 1 usually locate outside the reaction chamber 7, and the vacuum obtaining device enables a suitable vacuum level to be obtained and maintained inside the reaction chamber 7 during a plasma processing process, and the gas input device is used to input a process gas into the reaction chamber 7.

The reaction chamber 7 further has a gas outlet port 6, and gas inlet holes 5 of the reaction chamber 7 are distributed on the first electrode plate 3. A substrate to be processed (not shown in the figures) locates on the second electrode plate 4 and faces the first electrode plate 3. During the plasma processing process, the process gas is introduced into the reaction chamber 7 through the gas inlet holes 5; the process gas is excited by the power supply between the first electrode plate 3 and the second electrode plate 4 to generate plasma; the plasma reacts with the substrate; and the product of the reaction deposits on the substrate so as to form a film, while waste gas produced by the reaction is drawn out via the gas outlet port 6.

As shown in FIG. 3, in this embodiment, the first sub-electrode plate 31 is a rectangular frame, and the second sub-electrode plate 32 is also in a rectangular shape and located inside the rectangular frame of the first sub-electrode plate 31, that is these two sub-electrode plate 31 and 32 are arranged to be concentric nested, wherein the second sub-electrode plate 32 locates in the hollow region of the first sub-electrode plate 31, and the inner second sub-electrode plate 32 and the outer first sub-electrode plate 31 are spaced from each other by a certain distance and are insulated from each other.

As shown in FIG. 4, in this embodiment, the distribution units are capacitors, and the power distribution device 9 includes a capacitor C1 and a capacitor C2; each of these capacitors is respectively connected to one of the sub-electrode plates of the first electrode plate 3, that is to say, the capacitor C1 is connected to the first sub-electrode plate 31 and the capacitor C2 is connected to the second sub-electrode plate 32; a respective capacitor and its corresponding sub-electrode plate constitute one distribution branch, and all distribution branches are connected in parallel.

It can be seen that the power output from the power supply device 1, after being impedance-matched by the matching device 8, is input into the power distribution device 9, the input power is distributed by the capacitor C1 and the capacitor C2 in the power distribution device 9, and then separately input to the two sub-electrode plates 31 and 32 of the first electrode plate 3. By distributing and inputting the power of the power supply device 1 to the two sub-electrode plates 31 and 32 of the first electrode plate 3, the peripheral part and the center part of the first electrode plate 3 can be made to have different electric field distribution, so as to avoid the standing wave effect and the edge effect of electric field distribution of a big electrode plate, thus enabling the plasma processing apparatus to obtain an uniform distribution of plasma during the processing process, and improving the uniformity of the plasma processing.

Moreover, the plasma processing apparatus provided by the present invention is not limited to the case of two sub-electrode plates and two distribution units in the above embodiments, rather, it could includes more than two sub-electrode plates and more than two distribution units, that is to say, the power distribution device includes at least two distribution units and the first electrode plate includes at least two sub-electrode plates, and the respective distribution units are connected in parallel after being connected to a corresponding sub-electrode plate, and the respective sub-electrode plates are insulated from each other.

At this time, the power supply device is connected to the power distribution device via the matching device, and the power of the power supply device is distributed into several portions corresponding to the number of the sub-electrode plates of the first electrode plate, wherein each portion of the power is input to a corresponding sub-electrode plate, and an individual electric field is obtained between each sub-electrode plate and the second electrode plate to control the density and the intensity of plasma generated under each sub-electrode plate, and the process result is thus adjusted to obtain an uniform process result. Therefore, the PECVD apparatus provided by this embodiment can obtain an uniform plasma distribution, and the uniformity of the deposited film is thus increased.

Preferably, the capacitor C1 and the capacitor C2 in the power distribution device applied by above embodiment are adjustable capacitors, so that the power applied to each sub-electrode plate can be adjusted by adjusting the value of the capacitor connected to the sub-electrode plate, thus the density and the intensity of plasma generated by each sub-electrode plate can be adjusted to increase the uniformity of plasma obtained by a capacitively coupled discharge of the entire first electrode plate 3, and the uniformity of the result of the plasma processing process is thus increased.

Further, as shown in FIG. 3, the two sub-electrode plates 31 and 32 are provided with through holes 5, and the through holes on each sub-electrode plate are provided with the same size, the same shape and the same density. Of course, in practice, the size, the shape and the density of the through holes on different sub-electrode plates may be different.

Figure 5:
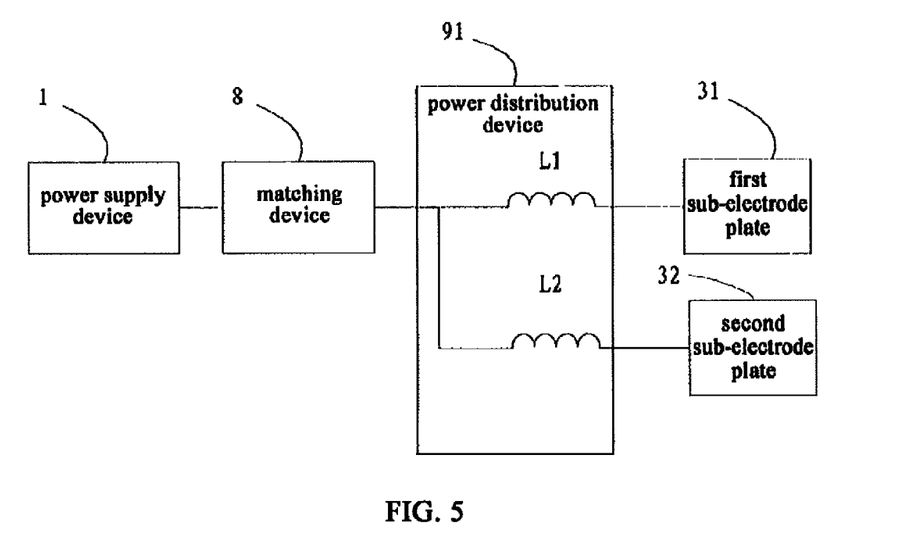
FIG. 5 is a schematic diagram of a circuit of another plasma processing apparatus in the first embodiment.

In the above embodiment, the distribution units of the power distribution device are all capacitors. However, in practice, they could also be inductors. As shown in FIG. 5, a schematic diagram of a circuit of a plasma processing apparatus in which inductors are used to replace the capacitors in the distribution units is shown. The difference between the plasma processing apparatus in FIG. 5 and that in FIG. 4 is that: the distribution units are inductors, and the power distribution device 91 includes an inductor L1 and an inductor L2; each inductor is respectively connected to one of the sub-electrode plates of the first electrode plate, that is to say, the inductor L1 is connected to the first sub-electrode plate 31 and the inductor L2 is connected to the second sub-electrode plate 32; a respective inductor and its corresponding sub-electrode plate constitute one distribution branch, and all distribution branches are connected in parallel. Preferably, the inductor L1 and the inductor L2 are adjustable inductors.

In this way, the power applied to each sub-electrode plate is adjusted by adjusting the value of the inductor connected to the sub-electrode plate, thus the density and the intensity of plasma generated by each sub-electrode plate is adjusted to increase the uniformity of plasma obtained by a capacitively coupled discharge of the entire first electrode plate, and the uniformity of the result of the plasma processing process is thus increased.

It could be appreciated that in practice, the distribution units are not limited to the above mentioned cases, rather, the distribution units could include both a capacitor and an inductor, and respective distributing units could be identical or different. The persons skilled in the art could obtain distribution units in the form of other circuit constitutions according to the basic concept of the present invention, and as long as the object of the present invention can be achieved, these distribution units are considered as falling into the protection scope of the present invention.

In the above embodiment, the first electrode plate includes two sub-electrode plates, however, the present invention is not limited to it, rather the first electrode plate may include more than two sub-electrode plates, and accordingly, the number of the distribution units in the power distribution device may also be more than two.

In the following, the second embodiment of the plasma processing apparatus provided by the present invention is described in detail in connection with the figures.

Second Embodiment

Figure 6:
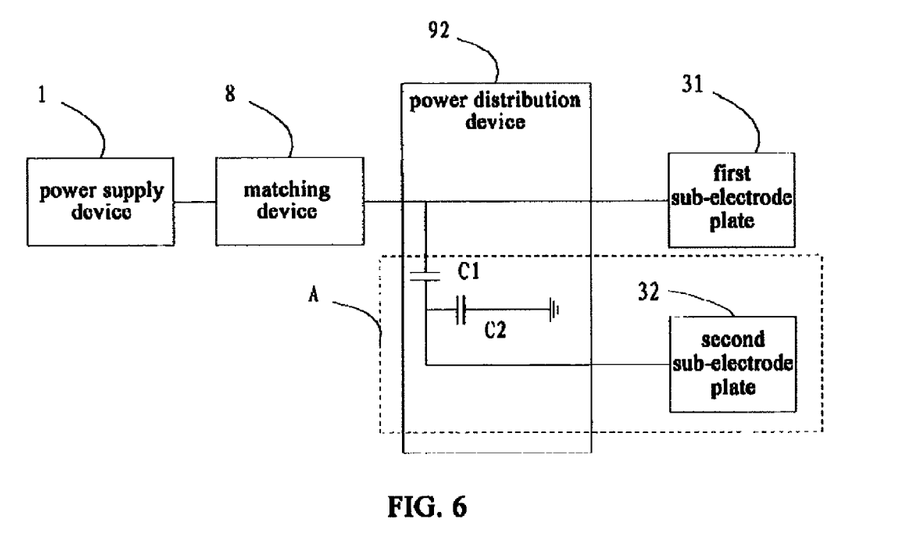
FIG. 6 is a schematic diagram of a circuit of a plasma processing apparatus in the second embodiment.

FIG. 6 is a schematic diagram of a circuit of the plasma processing apparatus provided by the second embodiment.

As shown in FIG. 6, the plasma processing apparatus provided by the second embodiment is basically similar to the plasma processing apparatus provided by the first embodiment, wherein the first electrode plate 3 includes the first sub-electrode plate 31 and the second sub-electrode plate 32. However, the difference between these two embodiments is that: the power distribution device 92 includes a first capacitor C1 and a second capacitor C2, and the matching device 8 is directly connected to the first sub-electrode plate 31, while the second capacitor C2 and the second sub-electrode plate 32 are connected in parallel, in turn connected to the first capacitor C1 in series, and then connected to the matching device 8.

It is equivalent that the parallel branch consisted of the second sub-electrode plate 32 and the second capacitor C2 is connected to the first capacitor C1 to form a series circuit A, and the series circuit A is then connected to the first sub-electrode plate 31 in parallel.

In the following, the third embodiment of the plasma processing apparatus provided by the present invention is described in detail in connection with the figures.

Third Embodiment

Figure 7:
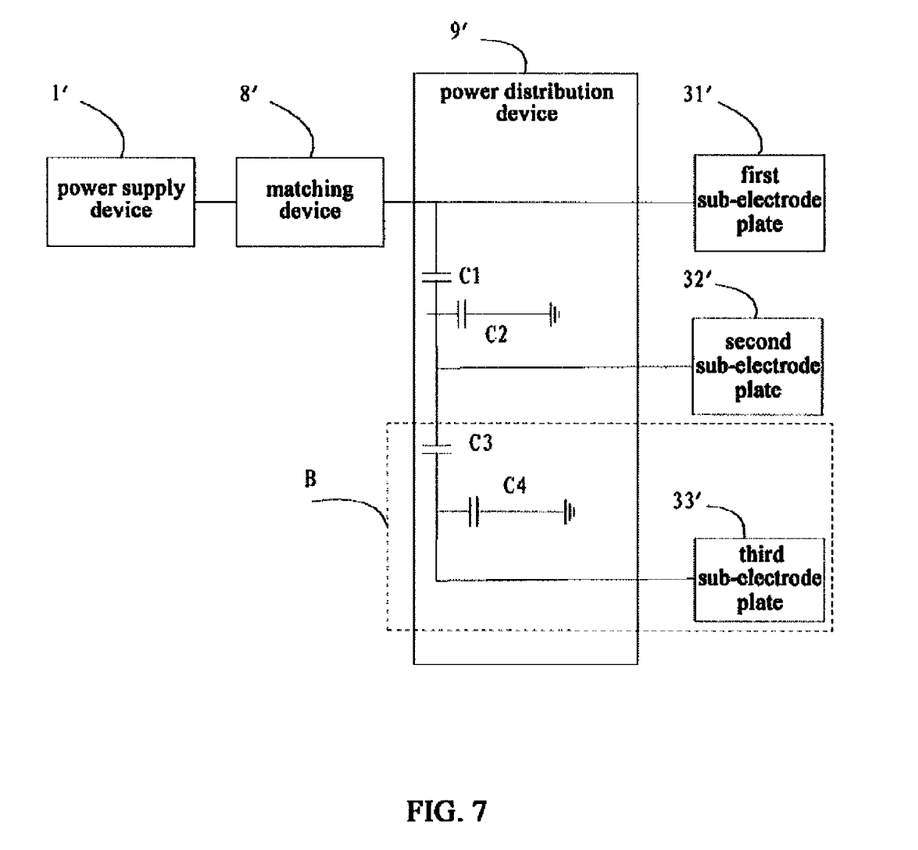
FIG. 7 is a schematic diagram of a circuit of a plasma processing apparatus in the third embodiment.

Reference is made to FIG. 7 which shows a schematic diagram of a circuit of the plasma processing apparatus provided by the third embodiment. As shown in the figure, a first electrode plate in the plasma processing apparatus includes three sub-electrode plates, i.e. a first sub-electrode plate 31', a second sub-electrode plate 32' and a third sub-electrode plate 33'; the power distribution device 9' in the plasma processing apparatus includes a first capacitor C1, a second capacitor C2, a third capacitor C3 and a fourth capacitor C4.

Compared to the second embodiment shown in FIG. 6, one sub-electrode plate is added into the first electrode plate of the third embodiment, and accordingly, the third capacitor C3 and the fourth capacitor C4 are added into the power distribution device 9', and the fourth capacitor C4 and the third sub-electrode plate 33' are connected in parallel, in turn connected to the third capacitor C3 in series to form a series circuit B, and the series circuit B is then connected to the second sub-electrode plate 32' in parallel.

Preferably, the capacitors in the embodiment are adjustable capacitors, and the power applied to each sub-electrode plate can be adjusted by adjusting the capacitance values of the capacitors (e.g. capacitors C1, C2, C3, C4 and so on), so as to further improve the uniformity of plasma obtained by a capacitively coupled discharge, and the uniformity of the result of the plasma processing process is thus increased. Of course, the capacitors mentioned above may be replaced by inductors, or replaced by a combination of capacitors and inductors.

Figure 8:
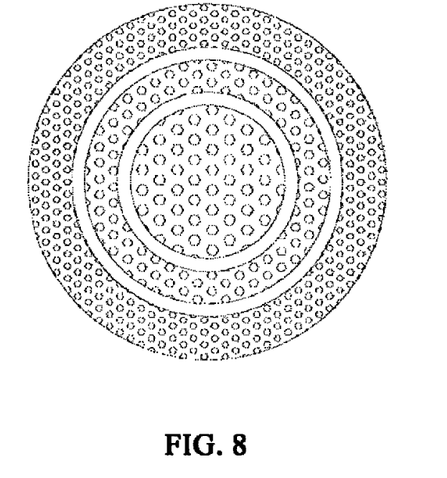
FIG. 8 is a bottom view of a first electrode plate in FIG. 7.

As for the shapes of the first sub-electrode plate 31', the second sub-electrode plate 32' and the third sub-electrode plate 33' in the embodiment, they may be nested circles as shown in the FIG. 8 for example, three concentric circular sub-electrode plates (the first sub-electrode plate 31', the second sub-electrode plate 32' and the third sub-electrode plate 33') are arranged to be nested in each other and are radially arranged in order of size of radiuses, wherein the circular sub-electrode plate 33' with a minimal radius is located in the center, and the circular sub-electrode plate 31' with a maximum radius is located at the periphery. Further, the distribution densities of the through holes on the three sub-electrode plates are different, and are gradually increased outwardly, i.e. the distribution density of the through holes on the third sub-electrode plate 33' located in the center is lowest, and the distribution density of the through holes on the first sub-electrode plate 31' located at the periphery is highest, while the distribution density of the through holes on the second sub-electrode plate 32' located between them falls between that on the first sub-electrode plate 31' and that on the third sub-electrode plate 33', It is noted that in practice, the shape of the sub-electrode plate is not limited to the shapes in the above embodiments, and it could be a rectangle, a square, a circle, an ellipse or a combination thereof, or other equivalent substitutions and obvious variants to the concept of the present invention. Further, the distribution densities of the through holes on the respective sub-electrode plates could be identical or different, and preferably, the distribution density of the through holes on a sub-electrode plate in the middle is looser, and the distribution density of the through holes on a sub-electrode plate at the periphery is denser. Apertures and shapes of the through holes on the respective sub-electrode plates could be identical or different. In summary, shapes, apertures and distribution densities of the through holes are related to the choice of input power of the respective supply power sub-devices, and can be obtained by limited times of experiment.

Figure 9:
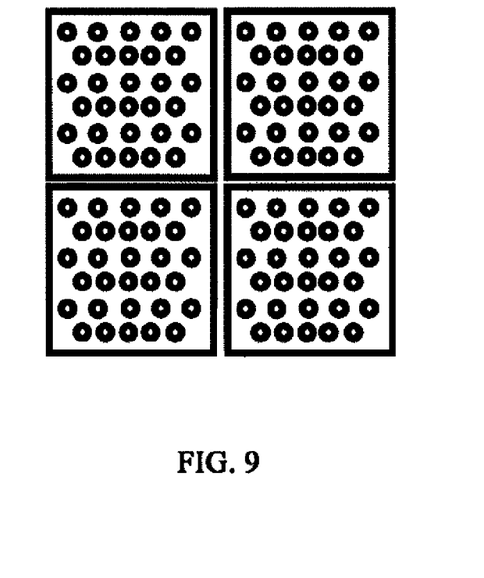
FIG. 9 is a schematic diagram of another first electrode plate in the third embodiment.

Moreover, the arrangement of the at least two sub-electrode plates is not limited to the manners in the above embodiments, and the at least two sub-electrode plates could be arranged to be parallel, centrally symmetric, axially symmetric or concentrically nested or other equivalent substitutions and obvious variants to the concept of the present invention. For example, as shown in FIG. 9, four rectangular sub-electrode plates are arranged to be parallel, and respective sub-electrode plates are spaced and insulated from each other;

accordingly, the power distribution device includes distribution units respectively corresponding to the four rectangular sub-electrode plates.

It is also noted that in practice, the number of sub-electrode plates included in the first electrode plate is not limited to two or three as mentioned in the above embodiments, but could be more than three; i.e. the first electrode plate may include N sub-electrode plates, wherein N is an integral number no less than 3. Accordingly, the power distribution device may include N capacitors, wherein each of the capacitors is individually connected to one sub-electrode plate, as described in the first embodiment; of course, similar to the second and third embodiments, the power distribution device may also include M capacitors, wherein $M=2(N-1)$, and N is an integral number no less than 3, wherein the $M^{th}$ capacitor and the $N^{th}$ sub-electrode plate are connected in parallel and then connected to the $(M-1)^{th}$ capacitor in series so as to form the $(N-1)^{th}$ series circuit; the $(N-1)^{th}$ series circuit, the $(N-1)^{th}$ sub-electrode plate and the $(M-2)^{th}$ capacitor are connected in parallel and then connected to the $(M-3)^{th}$ capacitor in series so as to form the $(N-2)^{th}$ series circuit, and so forth; until a series circuit formed by all foregoing capacitors and sub-electrode plates, a second sub-electrode plate and a second capacitor are connected in parallel and then connected to a first capacitor in series so as to form a first series circuit, and the first series circuit and a first sub-electrode plate are connected in parallel and then connected to the matching device. It can be seen that each sub-electrode plate corresponds to a series and parallel circuit formed by the sub-electrode plate and two capacitors.

Furthermore, the respective sub-electrode plates may also individually be connected to different gas input passages, and the amount of gas flowing out from respective sub-electrode plates are controlled individually, so as to adjust gas field distribution of process gas above the substrate, thus adjusting the distribution of plasma, and further increasing the uniformity of the result of the plasma processing process.

It could be appreciated that the plasma processing apparatuses provided by the present invention have been described above by example of the PECVD apparatus; however, in practice, the above mentioned structure that the first electrode plate includes at least two sub-electrode plates and the power distribution device is connected to the at least two sub-electrode plates could also be applied to other plasma processing apparatuses such as an etch apparatus, and such plasma processing apparatuses also fall into the protection scope of the present invention. That is to say, the above description is only preferred embodiments of the present invention, and is not used to limit the present invention in any form.

It could be appreciated that, although the present invention is disclosed by means of preferred embodiments, the above embodiments are not for limiting the protection scope of the present invention. The persons skilled in the art could make many modifications and variants to the present invention without departing from the principle of the present invention. Any modification, equivalent substitution, improvement or the like falling within the sprits and the scopes of the present invention are intended to be included within the scope of protection of the present invention.

The invention claimed is:

1. A plasma processing apparatus, characterized in that, including:

a reaction chamber, a first electrode plate and a second electrode plate which are arranged opposite to each other in the reaction chamber, the first electrode plate being located in the top of the reaction chamber, the second electrode plate being located in a lower part of the reaction chamber for supporting a substrate to be processed, and the plasma processing apparatus further includes, a matching device, a power distribution device and a power supply device;

the first electrode plate includes at least two sub-electrode plates insulated from each other;

the power supply device is connected to the power distribution device through the matching device;

the power distribution device is connected to the first electrode plate, for inputting and distributing the power of the power supply device to each of the sub-electrode plates to obtain an individual electric field between each sub-electrode plate and the second electrode plate so as to control the density and the intensity of plasma generated under each sub-electrode plate;

and the power distribution device includes at least one of a capacitor and an inductor.

2. The plasma processing apparatus as claimed in claim 1, characterized in that the power distribution device includes at least two distribution units, the number of the distribution units is the same as that of the sub-electrode plates, and each one of the distribution units is individually connected to one sub-electrode plate.

3. The plasma processing apparatus as claimed in claim 2, characterized in that each one of the distribution units includes at least one of a capacitor and an inductor.

4. The plasma processing apparatus as claimed in claim 1, characterized in that the inductor is an adjustable inductor.

5. The plasma processing apparatus as claimed in claim 1, characterized in that the capacitor is an adjustable capacitor.

6. The plasma processing apparatus as claimed in claim 1, characterized in that the at least two sub-electrode plates include a first sub-electrode plate and a second sub-electrode plate; the power distribution device includes a first capacitor and a second capacitor; the matching device is directly connected to the first sub-electrode plate; and the second capacitor and the second sub-electrode plate are connected in parallel, in turn connected to the first capacitor in series, and then connected to the matching device.

7. The plasma processing apparatus as claimed in claim 6, characterized in that the at least two sub-electrode plates include N sub-electrode plates; accordingly, the power distribution device includes M capacitors, wherein the $M^{th}$ capacitor and the $N^{th}$ sub-electrode plate are connected in parallel and then connected to the $(M-1)^{th}$ capacitor in series so as to form the $(N-1)^{th}$ series circuit; the $(N-1)^{th}$ series circuit, the $(N-1)^{th}$ sub-electrode plate and the $(M-2)^{th}$ capacitor are connected in parallel and then connected to the $(M-3)^{th}$ capacitor in series so as to form the $(N-2)^{th}$ series circuit, and so forth; until a series circuit formed by all foregoing capacitors and sub-electrode plates, a second sub-electrode plate and a second capacitor are connected in parallel and then connected to a first capacitor in series so as to form a first series circuit, and the first series circuit and a first sub-electrode plate are connected in parallel and then connected to the matching device; wherein $M=2(N-1)$, and N is an integral number no less than 3.

8. The plasma processing apparatus as claimed in claim 6, characterized in that the capacitors are adjustable capacitors.

9. The plasma processing apparatus as claimed in claim 1, characterized in that the at least two sub-electrode plates are arranged so that they are parallel, centrally symmetric, axially symmetric or concentrically nested in a plane parallel to the second electrode plate.

10. The plasma processing apparatus as claimed in claim 1, characterized in that the sub-electrode plates are rectangular, square, circular, or elliptical.

* * * * *